United States Patent
Chou et al.

(10) Patent No.: US 10,854,973 B2
(45) Date of Patent: Dec. 1, 2020

(54) ANTENNA APPARATUS AND ELECTRONIC APPARATUS

(71) Applicants: An-Yao Chou, Taipei (TW); Shih-Chia Liu, Taipei (TW); Yen-Hao Yu, Taipei (TW); Li-Chun Lee, Taipei (TW); Jhin-Ciang Chen, Taipei (TW); Chao-Lin Wu, Taipei (TW); Jui-Hung Lai, Taipei (TW)

(72) Inventors: An-Yao Chou, Taipei (TW); Shih-Chia Liu, Taipei (TW); Yen-Hao Yu, Taipei (TW); Li-Chun Lee, Taipei (TW); Jhin-Ciang Chen, Taipei (TW); Chao-Lin Wu, Taipei (TW); Jui-Hung Lai, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 25 days.

(21) Appl. No.: 16/409,879

(22) Filed: May 13, 2019

(65) Prior Publication Data

US 2019/0348762 A1 Nov. 14, 2019

Related U.S. Application Data

(60) Provisional application No. 62/670,851, filed on May 13, 2018, provisional application No. 62/748,533, filed on Oct. 22, 2018.

(51) Int. Cl.
*H01Q 1/50* (2006.01)
*H01Q 5/335* (2015.01)
(Continued)

(52) U.S. Cl.
CPC ............. *H01Q 5/335* (2015.01); *H01Q 5/328* (2015.01); *H01Q 5/385* (2015.01);
(Continued)

(58) Field of Classification Search
CPC .. H01L 2924/30111; H03H 7/40; H02J 50/10; H02J 50/12; H01Q 5/307; H01Q 5/35; H01Q 5/50
(Continued)

(56) References Cited

U.S. PATENT DOCUMENTS

| 8,446,256 | B2 * | 5/2013 | Pinkham | ............ G06K 7/10356 |
| | | | | 340/10.3 |
| 2011/0136447 | A1 | 6/2011 | Pascolini et al. | |
| 2019/0229755 | A1 * | 7/2019 | Lee | ....................... H04B 1/0053 |

FOREIGN PATENT DOCUMENTS

| CN | 104586310 | 5/2015 |
| CN | 106229614 | 12/2016 |

(Continued)

OTHER PUBLICATIONS

"Office Action of Taiwan Counterpart Application", dated Apr. 6, 2020, p. 1-p. 8.

*Primary Examiner* — Thuy Vinh Tran
(74) *Attorney, Agent, or Firm* — JCIPRNET

(57) ABSTRACT

An antenna apparatus and an electronic apparatus are provided. The electronic apparatus includes the antenna apparatus. The antenna apparatus includes a radiator, a first and a second impedance control circuit. The radiator receives and transmits a radio frequency (RF) signal. The first impedance control circuit is electrically connected to the radiator and transmits the RF signal. The second impedance control circuit includes an impedance matching circuit and an inductor. The first end of the impedance matching circuit is electrically connected to the radiator. The impedance matching circuit adjusts the impedance matching of the radiator and transmits a sensing signal. The inductor is electrically connected to the second end of the impedance matching circuit. The inductor transmits a sensing signal, and blocks the RF signal. Accordingly, the structures of the
(Continued)

antenna and the circuit can be simplified, and the influence between the RF signal and the sensing signal can be reduced.

21 Claims, 6 Drawing Sheets

(51) Int. Cl.
| | |
|---|---|
| *H01Q 15/16* | (2006.01) |
| *H01Q 5/328* | (2015.01) |
| *H01Q 5/385* | (2015.01) |
| *H02J 50/12* | (2016.01) |
| *H03H 7/40* | (2006.01) |
| *H01Q 5/50* | (2015.01) |
| *H01Q 5/35* | (2015.01) |
| *H02J 50/10* | (2016.01) |
| *H01Q 5/307* | (2015.01) |

(52) U.S. Cl.
CPC .. *H01Q 15/167* (2013.01); *H01L 2924/30111* (2013.01); *H01Q 5/307* (2015.01); *H01Q 5/35* (2015.01); *H01Q 5/50* (2015.01); *H02J 50/10* (2016.02); *H02J 50/12* (2016.02); *H03H 7/40* (2013.01)

(58) Field of Classification Search
USPC ............ 361/679.01; 343/702, 745, 850, 852, 343/860, 861
See application file for complete search history.

(56) References Cited

FOREIGN PATENT DOCUMENTS

| | | |
|---|---|---|
| TW | M460421 | 8/2013 |
| TW | 201530909 | 8/2015 |
| TW | I549356 | 9/2016 |
| TW | 201709860 | 3/2017 |

\* cited by examiner

ANTENNA APPARATUS AND ELECTRONIC APPARATUS

CROSS-REFERENCE TO RELATED APPLICATION

This application claims the priority benefit of U.S. provisional application Ser. No. 62/670,851, filed on May 13, 2018, and U.S. provisional application Ser. No. 62/748,533, filed on Oct. 22, 2018. The entirety of each of the above-mentioned patent applications is hereby incorporated by reference herein and made a part of this specification.

BACKGROUND

Technical Field

The disclosure provides an antenna technology and more particularly, relates to an antenna apparatus and an electronic apparatus.

Description of Related Art

At present, the trend of notebook computers focuses mainly on narrow border and all-metal design. Following this trend, however, the Long Term Evolution (LTE) antenna is difficult to be designed. Further, a printed circuit board (PCB) with a clearance area is used as a design concept by a developer.

From another perspective, in recent years, electronic products (e.g., desktop computers, notebook computers, smartphones, etc.) have been gradually miniaturized, so that the various elements used by the products and appearances of the products are required to be accordingly adjusted to satisfy the needs. Some of the electronic elements are integrated, so that space may be effectively used. For instance, a wireless communication module and a proximity sensor may share the antenna radiator. Nevertheless, when the electronic elements are integrated, negative influences may be generated among the electronic elements. Therefore, a technology for improvement is needed to solve such problem.

SUMMARY

The disclosure provides an antenna apparatus and an electronic apparatus in which impedance control circuits are disposed on a radiator, so that a sensing signal is blocked on a transmission path of a radio frequency (RF) signal, and an RF signal is blocked on a transmission path of the sensing signal.

An embodiment of the disclosure provides an antenna apparatus including a radiator, a first impedance control circuit, and a second impedance control circuit. The radiator receives and transmits an RF signal. The first impedance control circuit is electrically connected to the radiator and transmits the RF signal. The second impedance control circuit includes an impedance matching circuit and an inductor. A first end of the impedance matching circuit is electrically connected to the radiator, and the impedance matching circuit is configured to adjust impedance matching of the radiator and transmit a sensing signal. The inductor is electrically connected to a second end of the impedance matching circuit, transmits the sensing signal, and blocks the RF signal.

Moreover, an embodiment of the disclosure further provides an electronic apparatus including an antenna apparatus. The antenna apparatus includes a radiator, a first impedance control circuit, and a second impedance control circuit. The radiator receives and transmits an RF signal. The first impedance control circuit is electrically connected to the radiator and transmits the RF signal. The second impedance control circuit includes an impedance matching circuit and an inductor. A first end of the impedance matching circuit is electrically connected to the radiator, and the impedance matching circuit is configured to adjust impedance matching of the radiator and transmit a sensing signal. The inductor is electrically connected to a second end of the impedance matching circuit, transmits the sensing signal, and blocks the RF signal.

In an embodiment of the disclosure, the impedance matching circuit includes a transmission line and a capacitor. A first end of the transmission line is electrically connected to the radiator, and the transmission line is configured to adjust impedance matching of the radiator and transmit a sensing signal. A first end of the capacitor is electrically connected to a second end of the transmission line and the inductor. A second end of the capacitor is grounded, and the capacitor blocks the sensing signal.

In an embodiment of the disclosure, the first impedance control circuit and the second impedance control circuit are electrically connected to a point of the radiator.

In an embodiment of the disclosure, the first impedance control circuit is electrically connected to one of a first point and a second point of the radiator, and the second impedance control circuit is electrically connected to the other one of the first point and the second point of the radiator.

In an embodiment of the disclosure, the first impedance control circuit blocks the sensing signal.

In an embodiment of the disclosure, the radiator includes a first branch unit and a second branch unit. The first branch unit and the second branch unit extend from one point of the radiator.

In an embodiment of the disclosure, the antenna apparatus further includes a first parasitic branch unit and a second parasitic branch unit. A first gap is between a first end of the first parasitic branch unit and the first branch unit, and the first end or a second end of the first parasitic branch unit is grounded. A second gap is between a first end of the second parasitic branch unit and the second branch unit, and a second end of the second parasitic branch unit is grounded.

In an embodiment of the disclosure, the antenna apparatus includes a grounding portion. A third gap is between the grounding portion and the radiator.

In an embodiment of the disclosure, the radiator senses whether an external object approaches to generate the sensing signal.

In an embodiment of the disclosure, the electronic apparatus further includes a housing. The housing has a frame, and the first branch unit and the second branch unit form a portion of the frame.

In an embodiment of the disclosure, the electronic apparatus further includes an RF processing module and a sensing module. A wireless communication module is coupled to the first impedance control circuit of the antenna apparatus and is configured to process the RF signal. The sensing module is coupled to the second impedance control circuit of the antenna apparatus and is configured to process the sensing signal.

Based on the above, in the antenna apparatus and the electronic apparatus provided by the embodiments of the disclosure, the antenna apparatus corresponding to frequency bands related to wireless communication is designed to be combined with the frame. In addition, in the embodiments of the disclosure, the radiator of the antenna is integrated with the proximity sensor, the impedance control circuits are provided to support the matching circuits required by different frequency bands, and the transmission path of the sensing signal is provided, so that overall antenna and circuit structure is simplified, and influences brought by the proximity sensor to the antenna apparatus are reduced.

To make the aforementioned more comprehensible, several embodiments accompanied with drawings are described in detail as follows.

DESCRIPTION OF THE EMBODIMENTS

Figure 1:
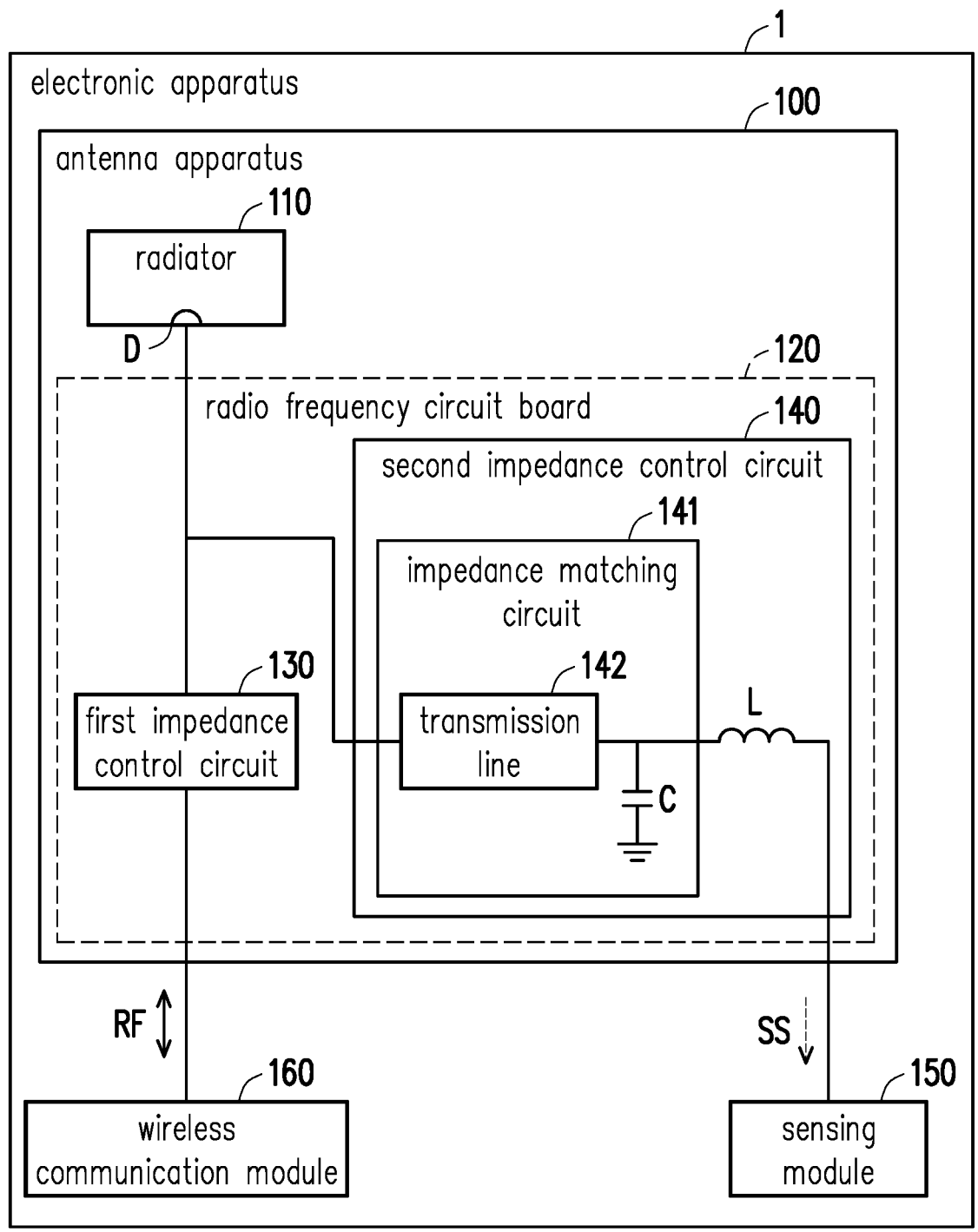
FIG. 1 is a block diagram of elements of an electronic apparatus according to an embodiment of the disclosure.

FIG. 1 is a block diagram of elements of an electronic apparatus 1 according to an embodiment of the disclosure. With reference to FIG. 1, the electronic apparatus 1 may be an apparatus such as a notebook computer, a smartphone, a tablet computer, a handheld game console and the like. The electronic apparatus 1 at least includes, but not limited to, an antenna apparatus 100, a sensing module 150, and a wireless communication module 160. The antenna apparatus 100 includes, but not limited to, a radiator 110, and a radio frequency (RF) circuit board 120.

Figure 2:
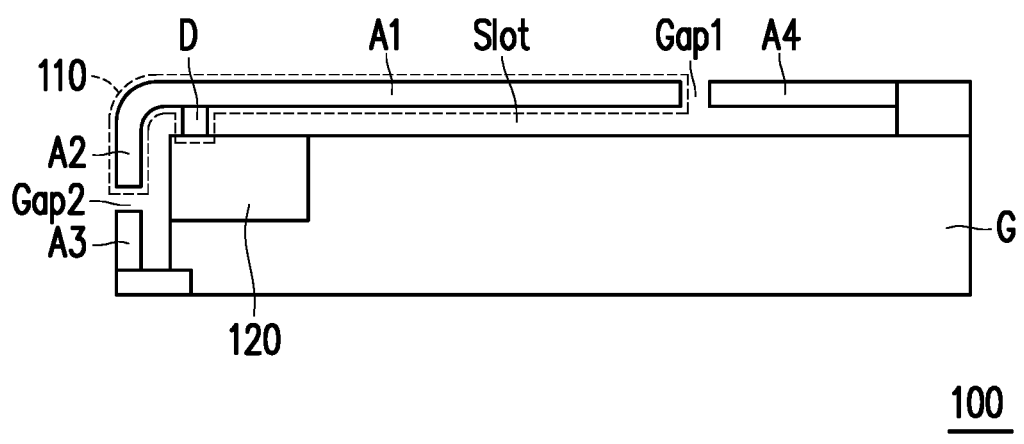
FIG. 2 is a schematic diagram of an antenna apparatus according to an embodiment of the disclosure.

FIG. 2 is a schematic diagram of the antenna apparatus 100 according to an embodiment of the disclosure. With reference to FIG. 2, the radiator 110 includes branch units A1 and A2 and a point D. The branch units A1 and A2 both extend from the point D and form a portion of a frame of a housing of the electronic apparatus 1 and respectively correspond to two different frequency bands (e.g., 1800 MHz and 900 MHz). The point D is electrically connected to the RF circuit board 120 and is configured to feed a feeding signal (e.g., a RF signal RF related to a mobile communication network shown in FIG. 1) of the wireless communication module 160, and accordingly transmits the feeding signal to the branch units A1 and A2 of the of the radiator 110. In this embodiment, the antenna apparatus 100 further includes parasitic branch units A3 and A4. The parasitic branch unit A3 extends from a grounding portion G of the antenna apparatus 100, and a gap Gap2 (about 2 millimeters (mm)) is between the parasitic branch unit A3 and the branch unit A2 (i.e., one end of the parasitic branch unit A3 is grounded, and the other end has a coupling gap with the branch unit A2). The parasitic branch unit A4 extends from the grounding portion G, and a gap Gap1 (about 2 mm) is between the parasitic branch unit A4 and the branch unit A1 (i.e., one end of the parasitic branch unit A4 is grounded, and the other end has a coupling gap with the branch unit A1). The branch units A1 and A2 and the parasitic branch units A3 and A4 of the radiator 110 may be perpendicular to a plane formed by the grounding portion G. In addition, a slot Slot (about 2 mm wide) is formed among the branch units A1 and A2, the parasitic branch units A3 and A4, and the grounding portion G, and a slot antenna having double opening ends (formed by the gaps Gap1 and Gap2) is accordingly formed, so that the RF signal RF related to the mobile communication network may thereby be received or transmitted. In addition, the branch units A1 and A2 of the radiator 110 may also sense whether an external object (not shown) approaches, so as to generate a sensing signal SS related to proximity sensing.

Note that shapes, positions, and connection manners of the radiator 110, the parasitic branch units A3 and A4, and the grounding portion G shown in FIG. 2 serve as an example only for description, and a variety of variations may be applied (e.g., the number of the branches may be increased or decreased, the length of the branch units A1 and A2 and the parasitic branch units A3 and A4 may be increased or decreased, the branch units A1 and A2 and the parasitic branch units A3 and A4 may be bent, the branch unit A2 may extend straight, and the branch unit A1, the parasitic branch unit A4 may be omitted, and so on), so as to support different frequency bands or to satisfy design requirement of the appearance of the electronic apparatus 1.

With reference to FIG. 1, the RF circuit board 120 includes a first impedance control circuit 130 and a second impedance control circuit 140. The first impedance control circuit 130 is electrically connected between the radiator 110 and the wireless communication module 160, so as to transmit the RF signal RF. The first impedance control circuit 130 may be a capacitor having fixed capacitance value or may be a chip or a circuit which is controlled to change antenna impedance such as an adjustable matching circuit and a variable capacitor. For instance, when the first impedance control circuit 130 is a variable capacitor, the capacitance thereof may be changed according to different voltage levels (i.e., a specific voltage level corresponds to specific capacitance or a capacitance range and corresponds to a specific operational frequency band), so that impedance may be changed by the first impedance control circuit 130.

The second impedance control circuit 140 includes an impedance matching circuit 141 and an inductor L. In this embodiment, the impedance matching circuit 141 includes a transmission line 142 and a capacitor C. One end of the transmission line 142 is electrically connected to the point D of the radiator 110, and the other end thereof is electrically connected to one end of the capacitor C and one end of the inductor L. The other end of the capacitor C is grounded (e.g., connected to the grounding portion G of FIG. 2, i.e., the transmission line 142 is connected to the grounding portion G through the capacitor C). The other end of the inductor L is connected to the sensing module 150. Through the foregoing design, the impedance matching circuit 141 may adjust impedance matching of the radiator 110 and transmits the sensing signal SS to the sensing module 150 through the inductor L. In addition, the first impedance control circuit 130 and the second impedance control circuit 140 formed on the RF circuit board 120 may act as multiplexers configured to process the RF signal RF and the sensing signal SS.

The sensing module 150 includes a proximity sensor chip to process the sensing signal SS. In this embodiment, the sensing module 150 detects the approaching of an external object (e.g., the human body) through the branch units A1 and A2 of the radiator 110 which acts as a sensing metal sheet. For instance, a variation of capacitance may be detected by the branch units A1 and A2, and the sensing signal SS is generated and is transmitted to the sensing module 150, so that whether an approaching external object exists may be determined. The capacitor C may block the sensing signal SS (i.e., the sensing signal SS does not pass through the capacitor C and is not transmitted to the grounding portion G). In addition, the first impedance control circuit 130 may block the sensing signal SS, that is, the sensing signal SS does not pass through the first impedance control circuit 130 and is not transmitted to the wireless communication module 160.

The wireless communication module 160 may integrate circuits such as an amplifier, a digital-analog converter, a mixer to generate the RF signal RF.

The impedance matching circuit 141 is configured to adjust the impedance matching of the radiator 110. For instance, the transmission line 142 may adjust the coupling of the RF signal RF for medium and higher frequency bands (e.g., 1,710-2,170 MHz and 2,300-2,690 MHz). In an embodiment, the capacitor C may have fixed capacitance value, adjusts the coupling of the RF signal RF for lower frequency band (e.g., 698-960 MHz) through a bypass capacitor (i.e., providing matching effect for the lower frequency band), and provides a bypass path of the RF signal RF for the medium and higher frequency bands. Note that the RF signal RF received by the radiator 110 is blocked by the inductor L, so that the RF signal RF does not pass through the inductor L and is not transmitted to the sensing module 150.

In addition, the first impedance control circuit 130 may also be used to adjust the impedance matching of the radiator 110. For instance, the first impedance control circuit 130 may adjust the coupling of the RF signal RF related to the lower frequency band (e.g., 698-960 MHz). In other words, the value of capacitance of the first impedance control circuit 130 affects the bandwidth and the resonant frequency of the RF signal RF or other antenna performance.

In thus can be seen that in the embodiments of the disclosure, the first impedance control circuit 130 and the second impedance control circuit 140 may respectively form an RF signal transmission path and a sensing signal transmission path. In this way, the received RF signal RF is transmitted to the wireless communication module 160 but is not transmitted to the sensing module 150, and the sensing signal SS is transmitted to the sensing module 150 but is not transmitted to the wireless communication module 160, so that mutual influences between the proximity sensor and the antenna apparatus 100 may be reduced.

Figure 3A:
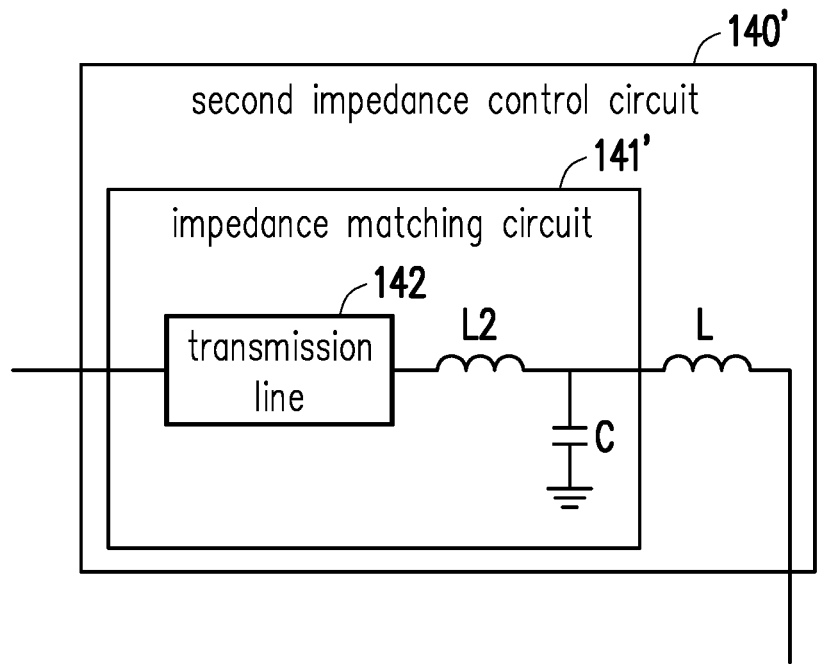
FIG. 3A is a schematic diagram of an impedance control circuit according to another embodiment of the disclosure.

FIG. 3A is a schematic diagram of a second impedance control circuit 140' according to another embodiment of the disclosure. A difference between the second impedance control circuit 140' and the second impedance control circuit 140 of FIG. 1 is that in the impedance matching circuit 141', an inductor L2, is further coupled between the transmission line 142 and the inductor L to enhance inductance of the transmission line 142, so that the impedance matching of the radiator 110 may be adjusted.

Figure 3B:
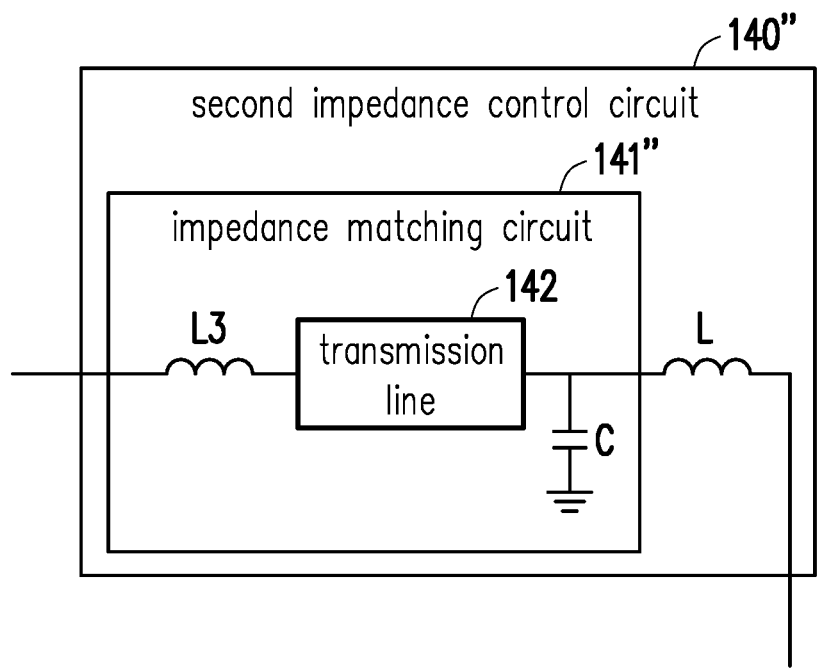
FIG. 3B is a schematic diagram of an impedance control circuit according to another embodiment of the disclosure.

FIG. 3B is a schematic diagram of a second impedance control circuit 140" according to another embodiment of the disclosure. A difference between the second impedance control circuit 140" and the second impedance control circuit 140 of FIG. 1 is that in the impedance matching circuit 141", an inductor L3, is further coupled between the transmission line 142 and the point D to enhance inductance of the transmission line 142, so that the impedance matching of the radiator 110 may be adjusted.

From another perspective, the antenna apparatus 100 shown in FIG. 1 includes a feeding design with a single point (i.e., through the point D), but variations may be applied to the antenna apparatus 100.

Figure 4:
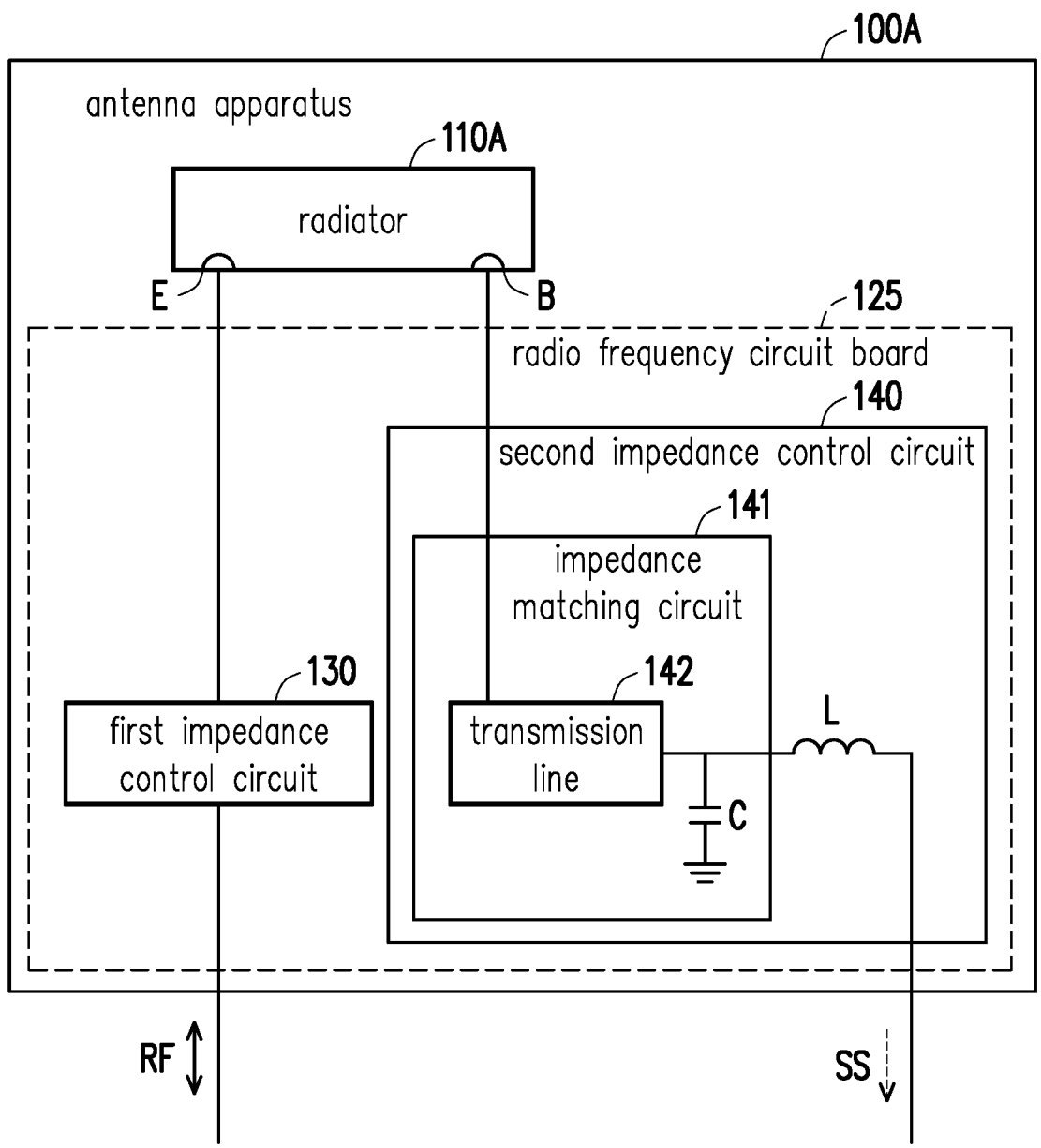
FIG. 4 is a block diagram of elements of an antenna apparatus according to another embodiment of the disclosure.

FIG. 4 is a block diagram of elements of an antenna apparatus 100A according to another embodiment of the disclosure. With reference to FIG. 4, a difference between the antenna apparatus 100A and the antenna apparatus 100 of FIG. 1 is that a radiator 110A of the antenna apparatus 100A includes a feeding design with double points, and the antenna apparatus 100A includes an RF circuit board 125. A point B may be a feeding point, and a point E may be a grounding point, or alternatively, the point E may be the feeding point, and the point B may be the grounding point. A distance between the point B and the point E may affect a length of a signal transmission path. In this embodiment, the first impedance control circuit 130 and the second impedance control circuit 140 may be integrated onto an RF circuit board 125 (e.g., a printed circuit board) and are fixed to the grounding portion G. Besides, a difference between the RF circuit board 125 and the RF circuit board 120 in FIG. 1 is that the transmission line 142 in the second impedance control circuit 140 is connected to the point B, and the impedance control circuit 140 is connected to the point E.

Figure 5A:
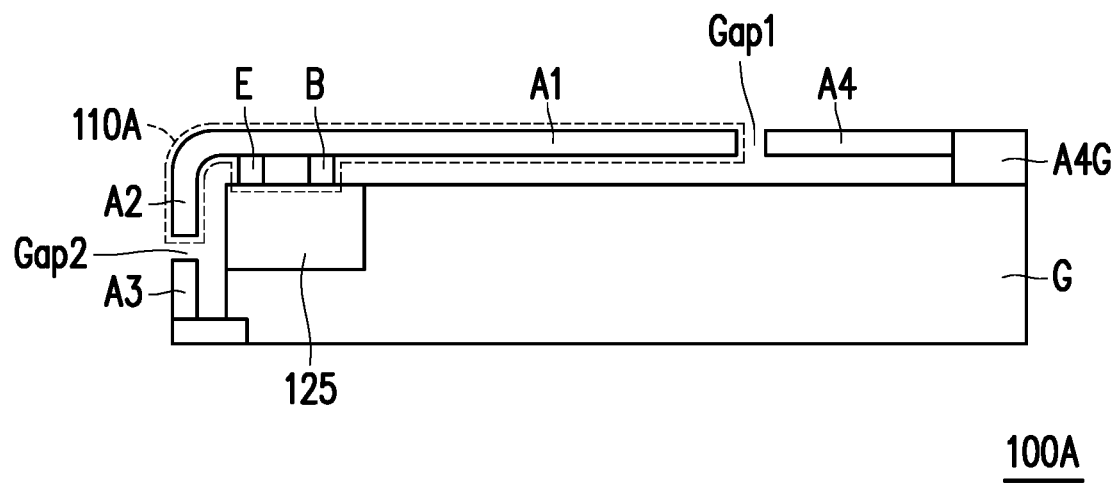
FIG. 5A is a schematic diagram of the antenna apparatus in FIG. 4.

FIG. 5A is a schematic diagram of the antenna apparatus 100A in FIG. 4. With reference to FIG. 5A, a difference between the antenna apparatus 100A and the antenna apparatus 100 in FIG. 2 is that branch units A1 and A2 of the radiator 110A respectively extend from the points B and E and share the points B and E to be feeding point or grounding point.

It is worth noting that the inductor L in the RF circuit board 125 may similarly block the RF signal RF and allow the sensing signal SS to pass through, and the capacitor C and the first impedance control circuit 130 may block the sensing signal SS and allow the RF signal RF to pass through.

Figure 5B:
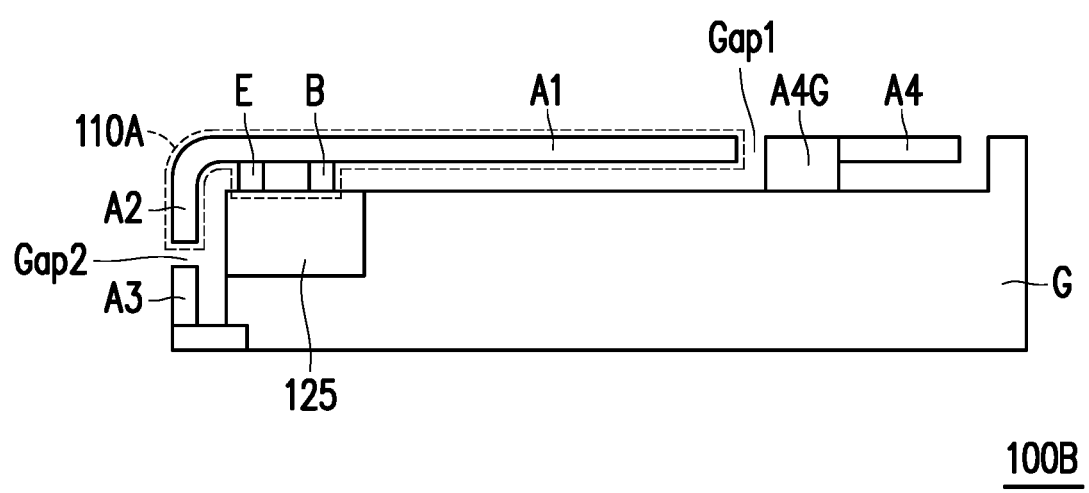
FIG. 5B is a schematic diagram of an antenna apparatus according to another embodiment of the disclosure.

Note that variations may be applied to the antenna apparatus 110A according to different design requirements. FIG. 5B is a schematic diagram of an antenna apparatus 110B according to another embodiment of the disclosure. With reference to FIG. 5B, a difference between the antenna apparatus 110B and the antenna apparatus 110A in FIG. 5A is that positions of the parasitic branch unit A4 and a parasitic grounding unit A4G extending from the grounding portion G are different. In FIG. 5B, the parasitic grounding unit A4G is disposed at one end of the parasitic branch unit A4 close to the branch unit A1, while in FIG. 5A, the parasitic grounding unit A4G is disposed at one end of the parasitic branch unit A4 away from the branch unit A1.

Figure 6A:
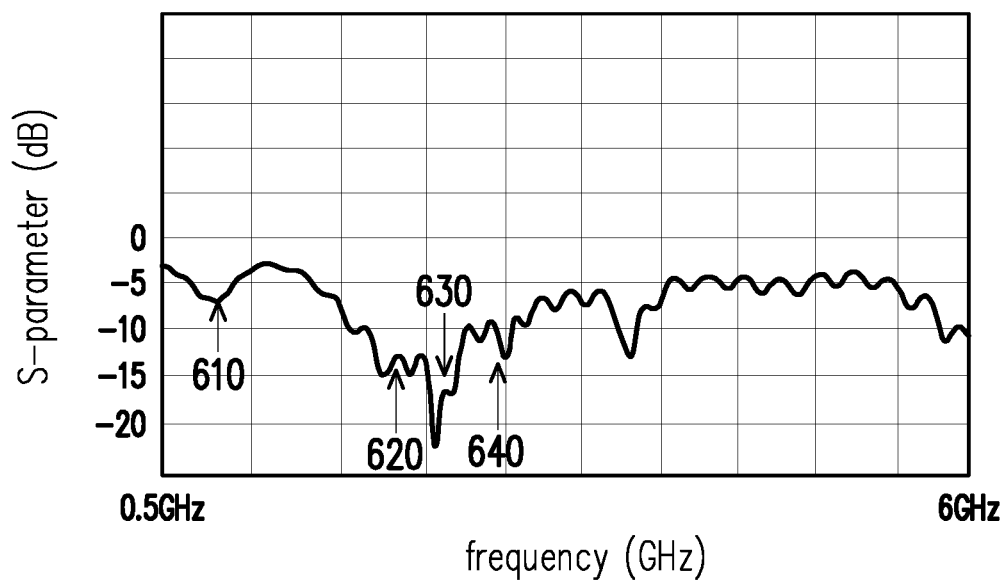
FIG. 6A is a chart of scattering parameters of FIG. 5A.

FIG. 6A is a chart of scattering parameters of FIG. 5A. With reference to FIG. 5A and FIG. 6A, a fundamental resonant mode 610 corresponding to the branch unit A1 is generated at about 698-960 MHz. A higher order mode 630 corresponding to the branch unit A1, a resonant mode 620 corresponding to the branch unit A2, and a resonant mode 640 corresponding to the parasitic branch unit A3 are generated at about 1,710-2,690 MHz.

Figure 6B:
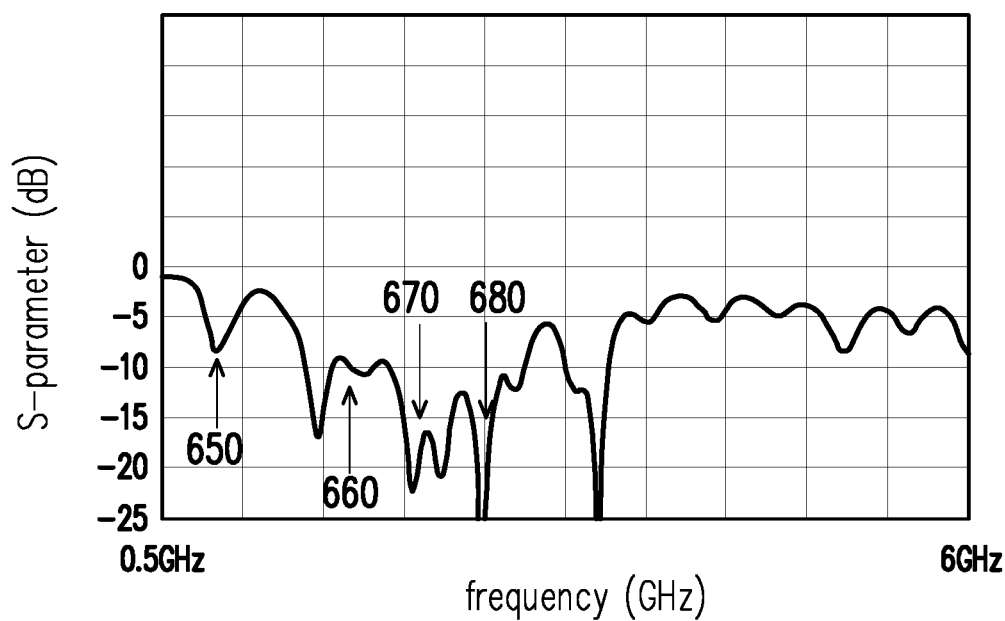
FIG. 6B is a chart of scattering parameters of FIG. 2.

FIG. 6B is a chart of scattering parameters of FIG. 2. With reference to FIG. 2 and FIG. 6B, a fundamental frequency resonance mode 650 corresponding to the branch unit A1 is generated at about 698-960 MHz. A higher order mode 670 corresponding to the branch unit A1, a resonance mode 660 corresponding to the branch unit A2, and a resonance mode

680 corresponding to the parasitic branch unit A3 are generated at about 1,710-2,690 MHz.

It is worth noting that the antenna structures of the antenna apparatuses 100, 100A, and 100B are provided to serve as examples for illustration only, and the antenna structures provided in other embodiments may be different, which is not limited by the disclosure.

In addition, according to different design requirements, the radiators 110 and 110A in the antenna apparatuses 100, 100A, and 100B may be disposed at any position in the electronic apparatus 1. For instance, if the branch units A1 and A2 and the parasitic branch units A3 and A4 in the antenna structures of the antenna apparatuses 100, 100A, and 100B are disposed in the frame of the housing of the electronic apparatus 1 (i.e., the branch units A1 and A2 and the parasitic branch units A3 and A4 form one portion of the frame), more space is saved in the housing to be provided for accommodating electronic devices such as a display screen, a keyboard, a hard disk drive, a mainboard, and a touch pad.

In view of the foregoing, in the antenna apparatus and the electronic apparatus provided by the embodiments of the disclosure, the open circuit, short circuit, and impedance control circuit design is created to be used for the antenna structure and thus is suitable for narrow border and metal material applications, and that the frame antenna design is achieved. In addition, in the impedance control circuits provided by the embodiments of the disclosure, the coupling of the antenna is improved, and the sensing signal transmitted by the proximity sensor is optimized. The designed transmission line may be used for both the RF signal and the sensing signal to provide different functions, and the two signals are also prevented from mutually affecting respective functions and operations.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An antenna apparatus, comprising:
    a radiator, receiving and transmitting a radio frequency signal;
    a first impedance control circuit, electrically connected to the radiator and transmitting the radio frequency signal; and
    a second impedance control circuit, comprising:
        an impedance matching circuit, wherein a first end of the impedance matching circuit is electrically connected to the radiator, and the impedance matching circuit is configured to adjust impedance matching of the radiator and transmit a sensing signal; and
        an inductor, electrically connected to a second end of the impedance matching circuit, transmitting the sensing signal, and blocking the radio frequency signal.

2. The antenna apparatus as claimed in claim 1, wherein the impedance matching circuit comprises:
    a transmission line, wherein a first end of the transmission line is electrically connected to the radiator, and the transmission line is configured to adjust the impedance matching of the radiator and transmit the sensing signal; and
    a capacitor, wherein a first end of the capacitor is electrically connected to a second end of the transmission line and the inductor, and a second end of the capacitor is grounded, wherein the capacitor blocks the sensing signal.

3. The antenna apparatus as claimed in claim 1, wherein the first impedance control circuit and the second impedance control circuit are electrically connected to a first point of the radiator.

4. The antenna apparatus as claimed in claim 1, wherein the first impedance control circuit is electrically connected to one of a first point and a second point of the radiator, and the second impedance control circuit is electrically connected to the other one of the first point and the second point of the radiator.

5. The antenna apparatus as claimed in claim 1, wherein the first impedance control circuit blocks the sensing signal.

6. The antenna apparatus as claimed in claim 1, wherein the radiator comprises:
    a first branch unit, extending from a point of the radiator; and
    a second branch unit, extending from the point of the radiator.

7. The antenna apparatus as claimed in claim 6, further comprising:
    a first parasitic branch unit, wherein a first gap is between a first end of the first parasitic branch unit and the first branch unit, and the first end or a second end of the first parasitic branch unit is grounded; and
    a second parasitic branch unit, wherein a second gap is between a first end of the second parasitic branch unit and the second branch unit, and a second end of the second parasitic branch unit is grounded.

8. The antenna apparatus as claimed in claim 1, further comprising:
    a grounding portion, wherein a third gap is between the grounding portion and the radiator.

9. The antenna apparatus as claimed in claim 1, wherein the radiator senses whether an external object approaches, so as to generate the sensing signal.

10. An electronic apparatus, comprising:
    an antenna apparatus, comprising:
        a radiator, receiving and transmitting a radio frequency signal;
        a first impedance control circuit, electrically connected to the radiator and transmitting the radio frequency signal; and
        a second impedance control circuit, comprising:
            an impedance matching circuit, wherein a first end of the impedance matching circuit is electrically connected to the radiator, and the impedance matching circuit is configured to adjust the impedance matching of the radiator and transmit the sensing signal; and
            an inductor, electrically connected to a second end of the impedance matching circuit, transmitting the sensing signal, and blocking the radio frequency signal.

11. The electronic apparatus as claimed in claim 10, wherein the impedance matching circuit comprises:
    a transmission line, wherein a first end of the transmission line is electrically connected to the radiator, and the transmission line is configured to adjust the impedance matching of the radiator and transmit the sensing signal; and
    a capacitor, wherein a first end of the capacitor is electrically connected to a second end of the transmission line and the inductor, and a second end of the capacitor is grounded, wherein the capacitor blocks the sensing signal.

12. The electronic apparatus as claimed in claim 10, wherein the first impedance control circuit and the second impedance control circuit are electrically connected to a first point of the radiator.

13. The electronic apparatus as claimed in claim 10, wherein the first impedance control circuit is electrically connected to one of a first point and a second point of the radiator, and the second impedance control circuit is electrically connected to the other one of the first point and the second point of the radiator.

14. The electronic apparatus as claimed in claim 10, wherein the first impedance control circuit blocks the sensing signal.

15. The electronic apparatus as claimed in claim 10, wherein the radiator comprises:
   a first branch unit, extending from a point of the radiator; and
   a second branch unit, extending from a point of the radiator.

16. The electronic apparatus as claimed in claim 15, wherein the antenna apparatus further comprises:
   a first parasitic branch unit, wherein a first gap is between a first end of the first parasitic branch unit and the first branch unit, and the first end or a second end of the first parasitic branch unit is grounded; and
   a second parasitic branch unit, wherein a second gap is between a first end of the second parasitic branch unit and the second branch unit, and a second end of the second parasitic branch unit is grounded.

17. The electronic apparatus as claimed in claim 16, further comprising:
   a housing, having a frame, wherein the first branch unit, the second branch unit, the first parasitic branch unit, and the second parasitic branch unit form a portion of the frame.

18. The electronic apparatus as claimed in claim 15, further comprising:
   a housing, having a frame, wherein the first branch unit and the second branch unit form a portion of the frame.

19. The electronic apparatus as claimed in claim 10, wherein the antenna apparatus further comprises:
   a grounding portion, wherein a third gap is between the grounding portion and the radiator.

20. The electronic apparatus as claimed in claim 10, wherein the radiator senses whether an external object approaches, so as to generate the sensing signal.

21. The electronic apparatus as claimed in claim 10, further comprising:
   a wireless communication module, coupled to the first impedance control circuit of the antenna apparatus, and configured to process the radio frequency signal; and
   a sensing module, coupled to the second impedance control circuit of the antenna apparatus, configured to process the sensing signal.

\* \* \* \* \*